(12) United States Patent
Sassine

(10) Patent No.: US 7,852,604 B2
(45) Date of Patent: Dec. 14, 2010

(54) SLIDER SUSPENSION ASSEMBLY INCLUDING A FLEX CIRCUIT ARM WITH A FLEX CIRCUIT TAB ATTACHED TO A GIMBAL SPRING ARM

(75) Inventor: Joseph H. Sassine, Lakeville, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 923 days.

(21) Appl. No.: 11/475,306

(22) Filed: Jun. 27, 2006

(65) Prior Publication Data

US 2007/0297094 A1 Dec. 27, 2007

(51) Int. Cl.
*G11B 21/16* (2006.01)
*G11B 5/48* (2006.01)

(52) U.S. Cl. .............. 360/245.3; 360/245.7; 360/245.9

(58) Field of Classification Search ............. 360/245.3, 360/245.7, 245.8, 245.9
See application file for complete search history.

(56) References Cited

U.S. PATENT DOCUMENTS

| | | | |
|---|---|---|---|
| 5,838,517 A | 11/1998 | Frater et al. ............... 360/104 |
| 5,877,920 A | 3/1999 | Resh ........................ 360/104 |
| 5,930,079 A | 7/1999 | Vera et al. .................. 360/104 |
| 5,959,807 A | 9/1999 | Jurgenson ................. 360/104 |
| 6,046,887 A * | 4/2000 | Uozumi et al. ........... 360/245.9 |
| 6,751,843 B2 | 6/2004 | Girard .................... 29/603.03 |
| 6,757,135 B2 | 6/2004 | Rancour et al. .......... 360/234.6 |
| 7,006,330 B1 * | 2/2006 | Subrahmanyam et al. ...................... 360/234.5 |
| 7,006,331 B1 * | 2/2006 | Subrahmanyam et al. ...................... 360/245.9 |
| 7,474,508 B1 * | 1/2009 | Li et al. ................... 360/245.2 |
| 7,567,410 B1 * | 7/2009 | Zhang et al. ............ 360/245.9 |
| 2003/0137774 A1 | 7/2003 | Fu et al. ................... 360/245.7 |
| 2003/0202285 A1 | 10/2003 | Arya et al. ............... 360/244.3 |
| 2003/0206376 A1 | 11/2003 | Erpelding et al. ........ 360/245.9 |
| 2003/0223152 A1 | 12/2003 | Erpelding ................ 360/245.3 |
| 2004/0032695 A1 | 2/2004 | Sassine et al. ........... 360/245.7 |
| 2004/0047078 A1 | 3/2004 | Budde et al. ............. 360/245.9 |
| 2004/0061975 A1 | 4/2004 | Boutaghou et al. ....... 360/244.8 |
| 2004/0226164 A1 | 11/2004 | Girard ..................... 29/603.03 |
| 2004/0240115 A1 | 12/2004 | Hutchinson et al. ...... 360/245.9 |
| 2004/0247921 A1 | 12/2004 | Dodsworth et al. ......... 428/544 |
| 2004/0257708 A1 | 12/2004 | Erpelding ................ 360/245.9 |
| 2004/0264054 A1 | 12/2004 | Hutchinson .............. 360/244.8 |
| 2004/0264055 A1 | 12/2004 | Wright .................... 360/244.9 |
| 2005/0044697 A1 | 3/2005 | Childers et al. .......... 29/603.06 |
| 2005/0044698 A1 | 3/2005 | Childers et al. .......... 29/603.06 |
| 2005/0047019 A1 | 3/2005 | Childers et al. .......... 360/244.3 |
| 2005/0047023 A1 | 3/2005 | Childers et al. .......... 360/245.9 |
| 2005/0099732 A1 | 5/2005 | Bonin et al. ............. 360/245.3 |
| 2005/0117255 A1 | 6/2005 | Shang ..................... 360/234.5 |
| 2005/0135013 A1 | 6/2005 | Sassine et al. ........... 360/244.9 |
| 2005/0138794 A1 | 6/2005 | Yao et al. ................. 29/603.03 |
| 2005/0161775 A1 | 7/2005 | Funada et al. ............... 257/643 |
| 2005/0190502 A1 | 9/2005 | Sassine et al. ........... 360/244.8 |
| 2008/0094756 A1 * | 4/2008 | Makino et al. ........... 360/245.9 |

* cited by examiner

*Primary Examiner*—Craig A. Renner
(74) *Attorney, Agent, or Firm*—David C. Bohn; Westman, Champlin & Kelly, P.A.

(57) ABSTRACT

A slider suspension assembly includes a positioning arm mounted to a laminate that has a spring layer and a flex circuit layer. The spring layer has a gimbal spring arm. The flex circuit layer has an elongate flex circuit arm separated from the elongate gimbal spring arm by a gap. The flex circuit layer include a flex circuit tab that extends across the gap to an attachment point on the gimbal spring arm.

20 Claims, 6 Drawing Sheets

SLIDER SUSPENSION ASSEMBLY INCLUDING A FLEX CIRCUIT ARM WITH A FLEX CIRCUIT TAB ATTACHED TO A GIMBAL SPRING ARM

FIELD OF THE INVENTION

The present invention relates generally to suspension assemblies, and more particularly but not by limitation to suspension assemblies for sliders in data storage devices.

BACKGROUND OF THE INVENTION

During a first manufacturing process of a disc drive, a slider, a metal gimbal spring, a track accessing arm and a flex circuit are assembled together with one another to form an E block assembly. The flex circuit generally runs adjacent a length of the gimbal spring and is rigidly affixed at a rigid metal mounting tab that protrudes along the length of the gimbal spring. The rigid metal mounting tab limits undesired motion of the flex circuit due to windage.

Multiple electrical contact pads at the end of the flex circuit are bonded to transducer contacts. As part of the manufacturing process, springs in the slider suspension system are then mechanically adjusted, typically by bending as needed, to provide a desired nominal pitch static attitude (PSA) and roll static attitude (RSA) to ensure proper flight of the slider during use. After the mechanical adjustments, there is localized residual stress from the bending remaining in the flex circuit. The residual stress relaxes over time. The forces that the flex circuit exerts on the slider change unpredictably with time and the nominal PSA and RSA shift undesirably.

During a second manufacturing process, an E-block assembly is assembled with other disc drive components to form a completed disc drive. At room temperature, the slider flies at a desired fly height and at a desired pitch static angle in order to accurately read and write data from discs in the disc drives.

As the areal density of discs is increased, however, it is found that there is a need for tighter control of pitch static angle in order to accurately read and write data on the disc. It is found, however, that PSA and RSA are not stable, and change over time as the residual stress relaxes. The changes are so large that they are unacceptable for use with higher areal densities.

The changes in PSA and RSA are found to be larger after the disc drive is exposed to temperature and/or mechanical loading. Applicants have discovered that the higher temperatures increases stress relaxation in copper conductors in the flex circuit. Applicants have also discovered that the unstable PSA and RSA variations are exacerbated by a rigid mounting of the flex circuit to the metal spring. It appears that a rigid mounting undesirably limits the motion of the flex circuit during SA adjust process, increasing the load carried by the flex circuit struts which increases residual stress in the copper traces. Residual stress tends to relax over time, particularly after being exposed to additional thermal or mechanical loading, resulting in undesired changes in PSA and RSA.

A method and apparatus are needed to provide increased stability in pitch static angle, particularly after exposure to high temperatures or additional mechanical loading during assembly process, without losing the damping benefits of the mounting tab.

Embodiments of the present invention provide solutions to these and other problems, and offer other advantages over the prior art.

SUMMARY OF THE INVENTION

A slider suspension assembly is disclosed. The slider suspension assembly comprises a positioning arm that has a mounting end and a gimbal end.

The slider suspension assembly comprises a laminate. The laminate is mounted to the positioning arm. The laminate includes a spring layer and a flex circuit layer.

The spring layer includes an elongate gimbal spring arm. The flex circuit layer includes an elongate flex circuit arm. The flex circuit arm is separated from the gimbal spring arm by a gap.

The flex circuit layer includes a flex circuit tab. The flex circuit tab extends across the gap to an attachment point on the gimbal spring arm.

Other features and benefits that characterize embodiments of the present invention will be apparent upon reading the following detailed description and review of the associated drawings.

DETAILED DESCRIPTION OF ILLUSTRATIVE EMBODIMENTS

In the embodiments described below, a laminate includes elongate flex circuit arms that extend alongside elongate gimbal spring arms in a slider suspension assembly. The flex circuit arms are separated from the spring arms by gaps. Flexible resin tabs are formed in the laminate and the tabs extend between the flex circuit arms and attachment points on the spring arms. When the spring arms are bent to adjust of pitch static angle (PSA) and roll static angle (RSA) of a slider that is suspended by the suspension assembly, the flexible resin tabs deflect and mechanically decouple the flex circuit arms from the spring arms. Similarly, when spring arm is bent "adjusted for PSA", the flex circuit tab deflects responsive to the bend, and the deflection reducing transmission of yield stress to the flex circuit. The flex circuit arms also bend when the spring arms are bent, resulting in unstable residual stress in the flex circuit arms. The decoupling provided by the flexible resin tabs isolates the spring arms and reduces the yield stress in the flex circuit. The PSA and RSA of the slider are stabilized against changes in residual stress. Higher areal densities can be transduced by the slider because of the increased stability in PSA and RSA.

Figure 1:
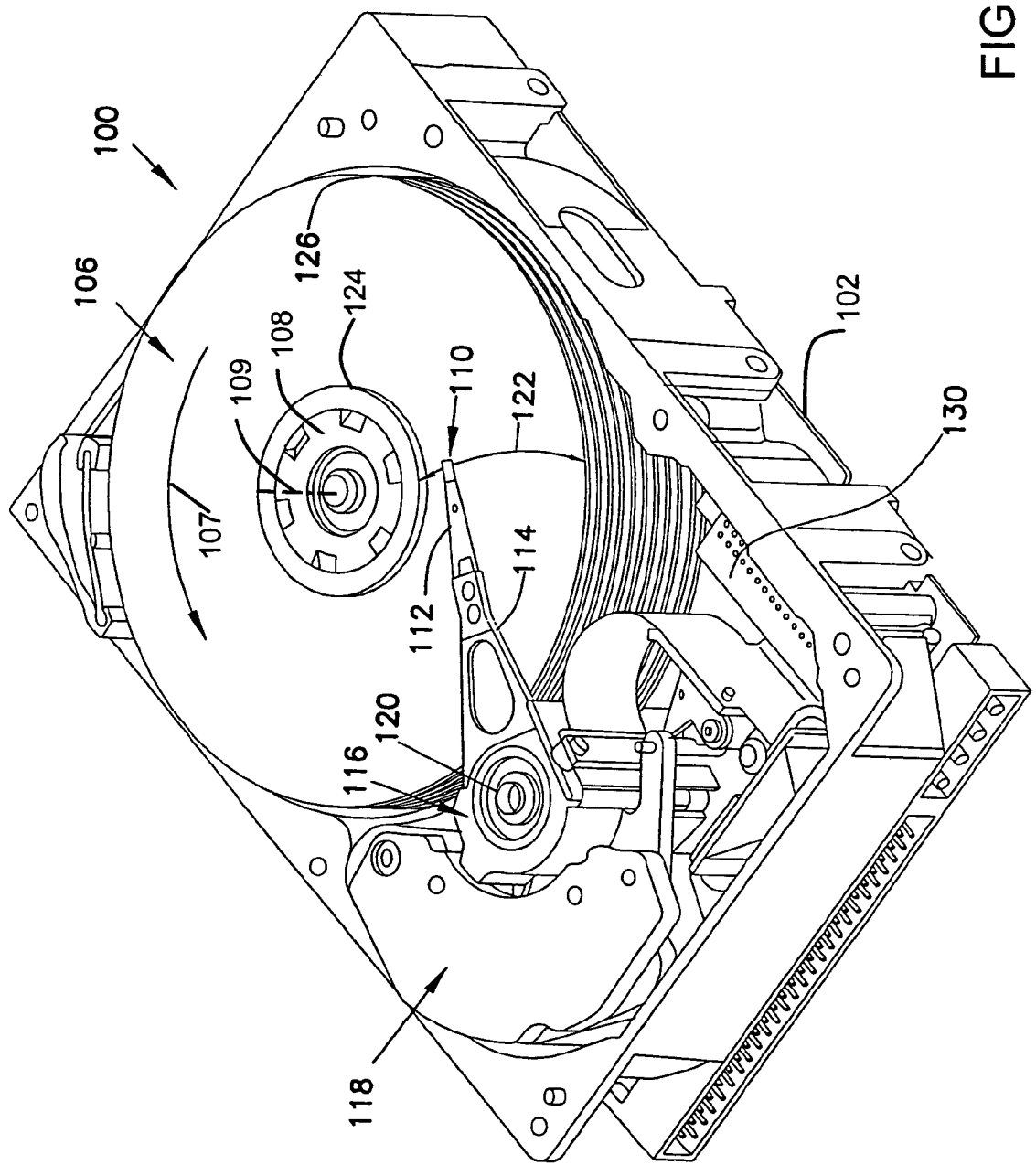
FIG. 1 illustrates an oblique view of a disc drive.

FIG. 1 illustrates an oblique view of a disc drive 100 in which embodiments of the present invention are useful. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs, which are mounted for co-rotation in a direction indicated by arrow 107 about central axis 109. Each disc surface has an associated disc read/write head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached read/write heads 110 about a pivot shaft 120 to position read/write heads 110 over a desired data track along an arcuate path 122 between a disc inner diameter 124 and a disc outer diameter 126. Voice coil motor 118 is driven by electronics 130 based on signals generated by read/write heads 110 and a host computer (not shown). The individual discs in the disc pack 106 are formatted with an array of data storage cells for storing data.

Figure 2:
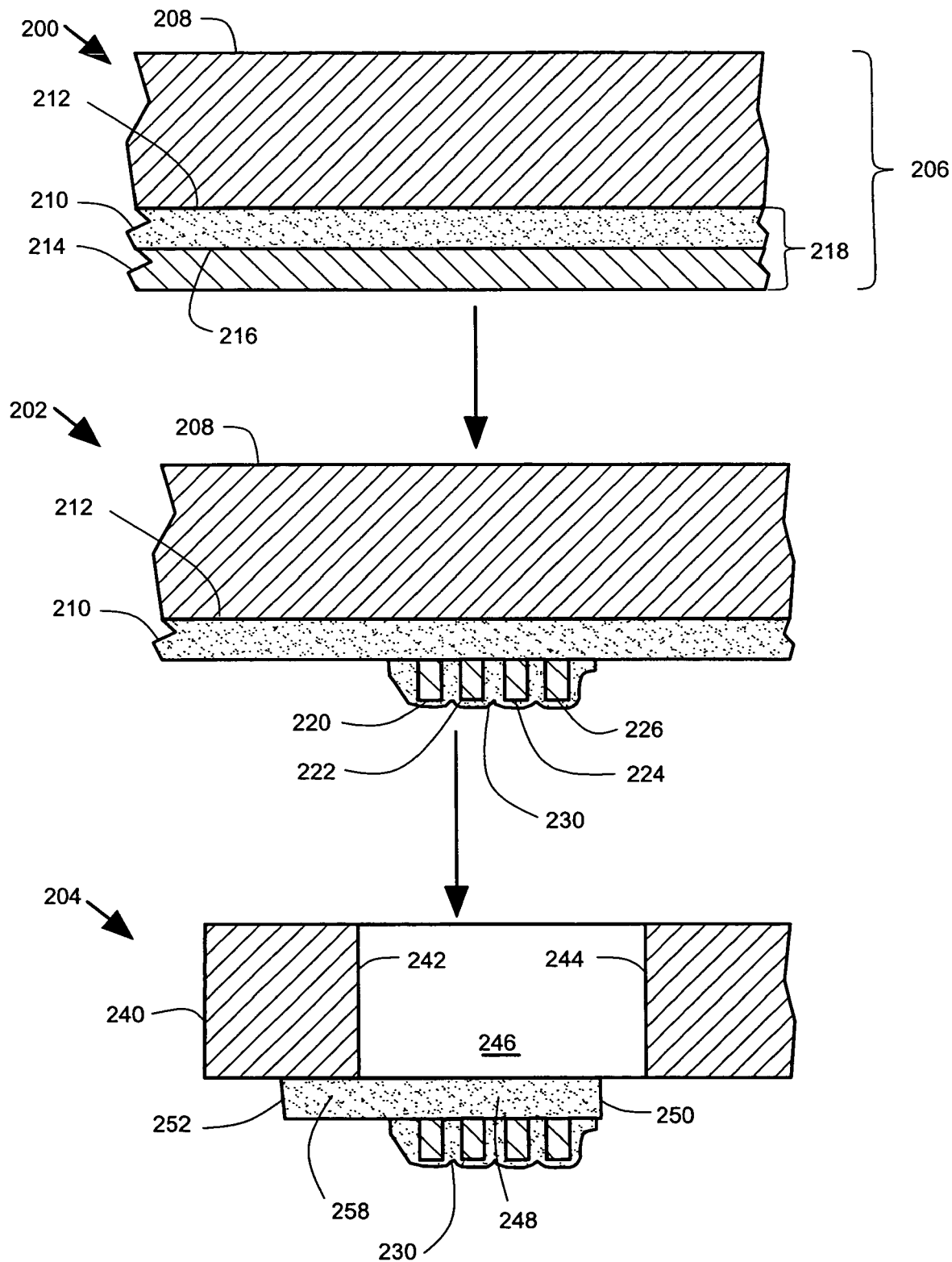
FIG. 2 illustrates process stages in preparing a laminate.

FIG. 2 illustrates process stages 200, 202, 204 in preparing a laminate. The process of preparing a laminate begins at process stage 200 with unprocessed (raw) sheet laminate material 206. The sheet laminate material 206 can be formed using any known method for making such laminates. Typically, the sheet laminate material 206 comprises a spring layer 208. The spring layer 208 is deflectable and has an inelastic range of deflection in which the spring layer 208 can be permanently shaped by bending. After shaping by bending, the spring layer 208 also has a more limited range of deflection in which the spring layer 208 is elastic and can function as a leaf spring. In this limited deflection range, deflections due to a bending are recoverable after the bending force is removed. The material of the spring layer 208 is selected to have low levels of mechanical creep and relaxation. In one embodiment, spring layer 208 is formed of spring steel or other suitable metals. The thickness, composition and heat treatment of the spring layer 208 are selected in a known manner to provide the desired spring characteristics for a particular application.

The sheet laminate material 206 also includes a flexible resin layer 210. The flexible resin layer 210 is continuously bonded to the steel laminate material 206 at surface 212. The flexible resin layer 210 is formed of a material that is electrically insulating and that remains flexible over a data storage device operating temperature range. The flexible resin layer 210 is formed of a material that has low friability and low outgassing to avoid contaminating a data storage device with either particles or undesired gases. In one embodiment, the flexible resin layer 210 is formed of polyimide resin. Other resins with the desired characteristics can also be used. The thickness of the flexible resin layer 210 is selected to be at least a large enough minimum thickness to electrically isolate a subsequently applied circuit trace layer 214 from the spring layer 208. The thickness of the flexible resin layer 210 can be increased, as needed, to increase mechanical damping, support or other desired mechanical characteristics for a particular application.

The sheet laminate material 206 comprises a circuit trace layer 214. The circuit trace layer 214 is continuously bonded to the flexible resin layer 210 at a surface 216. Taken together, the circuit trace layer 214 and the flexible resin layer 210 comprise a flex circuit layer 218. The circuit trace layer 214 comprises material that is electrically conductive and flexible. In one embodiment, the circuit trace layer 214 comprises a metal such as copper. In one embodiment, the circuit trace layer 214 comprises a first sublayer that comprises copper and a second sublayer that is selectively applied and includes a corrosion resistant metal such as electroless tin.

The sheet laminate material 206 can be formed using any known method for making such laminates. Typically, the spring layer 208 is a sheet of spring steel with a surface 212 that is microscopically roughened by etching. During a lamination process, a sheet of the spring layer 208 and a sheet of the flex circuit layer 218 are stacked and are fed together through heated nip rollers to bond the flex circuit layer 218 to the roughened surface of the spring layer 208. Solvents or adhesives can be used to improve bonding at the surface 212. Other known laminate formation methods can also be used, for example, plating the spring layer 208 on the flex circuit layer 218. Subsequent to formation of the raw sheet laminate material 206, step-and-repeat lithographic techniques are used to selectively remove portions of the layers 208, 210, 214 so that large arrays of micromechanical devices can be formed simultaneously as described below in connection with process stages 202, 204.

At process stage 202, the circuit trace layer 214 is selectively etched to remove portions of the circuit trace layer 214, leaving behind a printed circuit pattern of circuit traces 220, 222, 224, 226. The traces 220, 222, 224, 226 are the remaining portions of circuit trace layer 214 after selective etching. In one embodiment, the printed circuit pattern is formed by a photolithographic process. In one embodiment, selected portions of the circuit traces are covered with a conformal coating 230. In one embodiment, the conformal coating 230 is applied using screen printing or other known photolithographic coating processes. The conformal coating 230 can comprise polyimide or other known electrically insulating resins that are flexible and that have low friability and low outgassing in an operating temperature range of a data storage device.

At process stage 204, the spring layer 208 is selectively etched away, forming an outer laminate device edge 240 and edges 242, 244 of a through hole 246 in the spring layer 208. The selective etching of the spring layer 208 is performed using known photolithographic methods. At process stage 204, the flexible resin layer 210 is selectively etched away to shape a flexible circuit element 248 with outer edges 250, 252. The flexible circuit element 248 is the remaining portion of flexible resin layer 210 after etching. The flexible circuit element 248 includes a tab portion 258 where the flexible circuit element 248 is bonded to the spring layer 208. The tab region 258 is part of the flexible circuit element 248.

The shapes of various features shown in FIG. 2 are merely exemplary. Through the use of photolithographic techniques for shaping various layers, arbitrarily complex patterns can be formed for a single device, and large number of devices can be formed simultaneously using step-and-repeat lithography. The finished devices can include complex combinations of mechanical spring features, mechanical damping features and electrical connection features for use in microelectromechanical (MEMS) applications such as data storage devices, particularly disc drives. Laminated devices can be used in a slider suspension for gimbal mounting a slider to a positioning arm as described below in connection with FIGS. 3-6. While the processes shown in FIG. 2 are convenient for manufacture, it will be understood that separate springs and flexible circuit elements can also be assembled and used in the embodiments described below.

Figure 3:
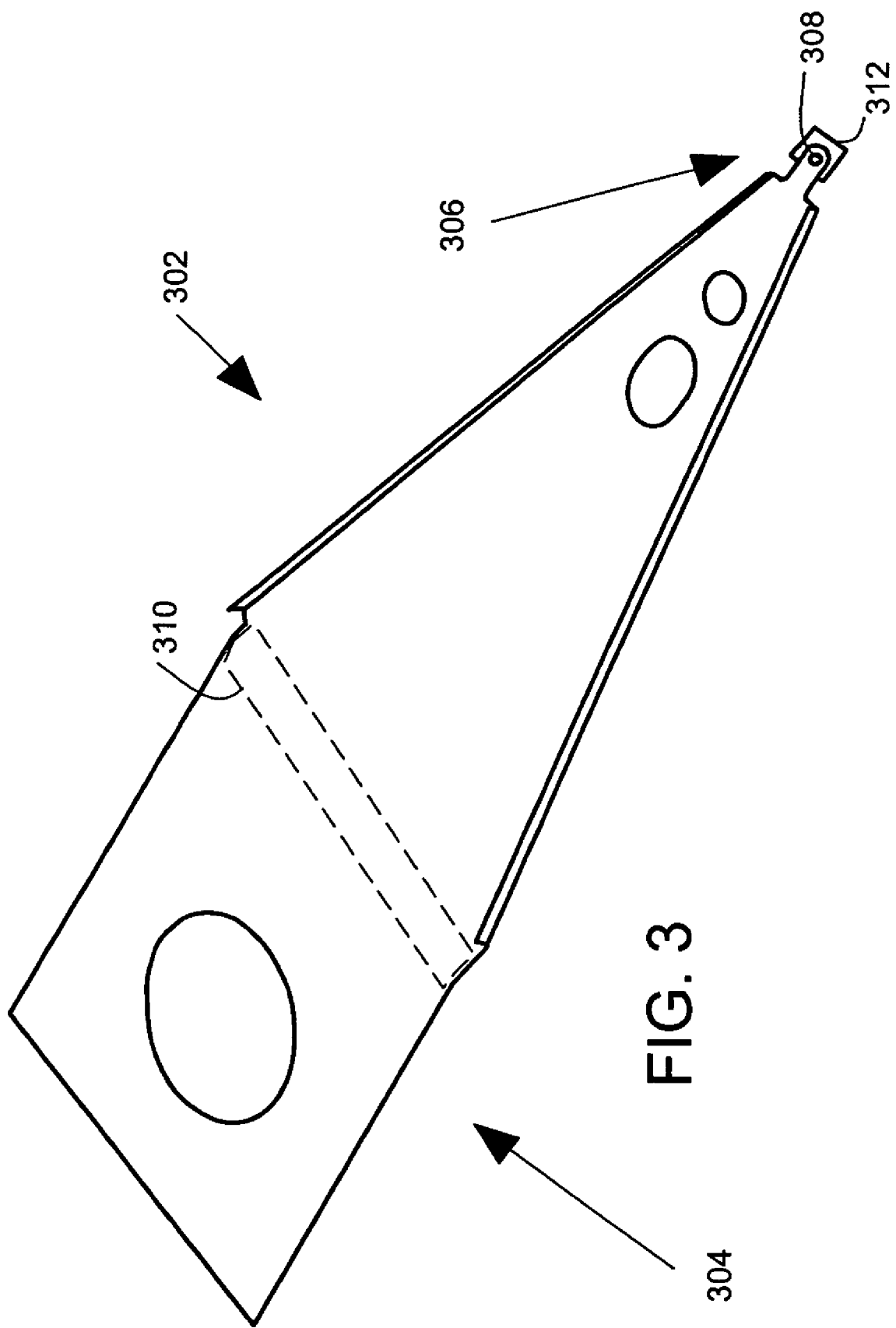
FIG. 3 illustrates a positioning arm for use in a data storage device.

FIG. 3 illustrates a positioning arm 302 for use in a data storage device. Positioning arm 302 corresponds generally with the track accessing arm 114 in FIG. 1. The positioning arm 302 comprises a mounting end 304 that is attachable to a pivot shaft (such as pivot shaft 120 in FIG. 1) of an actuator (such as actuator 116 in FIG. 1). The positioning arm 302 comprises a gimbal end 306 that includes a gimbal point 308. The positioning arm 302 includes a spring region 310. The spring region 310 is elastically deflected so that the positioning arm 302 exerts a downward force (preload) on the gimbal point 308. The downward preload on the gimbal point 308 is coupled to a slider 312 to urge the slider 312 toward a spinning storage media surface. The gimbal point 308 permits the underlying slider 312 to rotate in rotational ranges about the gimbal point 308. In operation, the gimbal point 308 exerts a downward preload force and a translational positioning force on the slider 312, but does not exert any substantial rotational (torsional) forces on the slider 312.

The slider 312 has an air bearing surface that aerodynamically interacts with a spinning layer of air adjacent the spinning media surface to generate lift that opposes the downward preload. An equilibrium is reached between the preload force and the aerodynamic force, and the slider 312 flies over the surface of the spinning media. Rotational (torsional) controls for the roll, pitch and yaw axes of the slider 312 are needed and are provided by a laminate described in more detail below in connection with examples illustrated in FIGS. 4-7.

Figure 4:
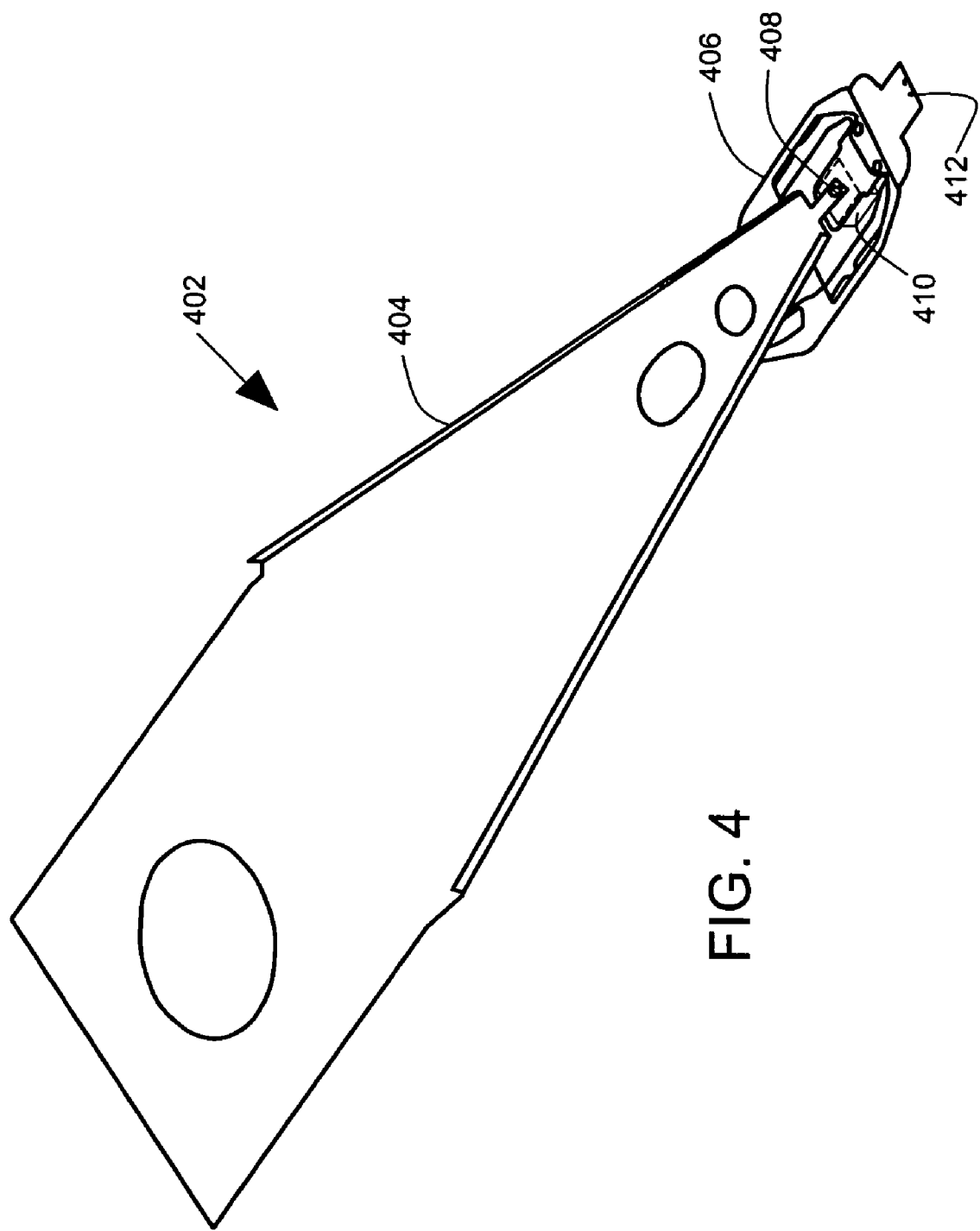
FIG. 4 illustrates a slider suspension assembly.

FIG. 4 illustrates a slider suspension assembly 402. The slider suspension assembly 402 comprises a positioning arm 404. Positioning arm 404 is comparable to positioning arm 302 in FIG. 3.

The slider suspension assembly 402 comprises a laminate 406. Laminate 406 is photolithographically shaped generally as described above in connection with FIG. 2. A gimbal point 408 applies a preload force to the laminate 406. It will be understood that the embodiment shown in FIG. 4 is merely exemplary, and that other known arrangements of slider suspension assemblies can also be used. A slider 410 underlies the laminate 406 directly under the gimbal point 408. The slider 410 receives the preload force through the laminate 406. The laminate 406 is mounted to the positioning arm 404 and to the slider 410. The laminate 406 provides roll, pitch and yaw control forces to the slider 410. The laminate 406 provides for electrical connection between circuitry on the slider 410 and disc drive electronics (such as electronics 130 in FIG. 1). The laminate 406 includes an optional surface 412 that can be engaged to park the slider suspension assembly 402 when the disc drive is shut off. In some embodiments, the surface 412 is used as a motion limiter instead of for parking. In other embodiments, the surface 412 is used as a support for circuit routing or as a grounding spot. The laminate 406 is described in more detail below in connection with an example illustrated in FIG. 5.

Figure 5:
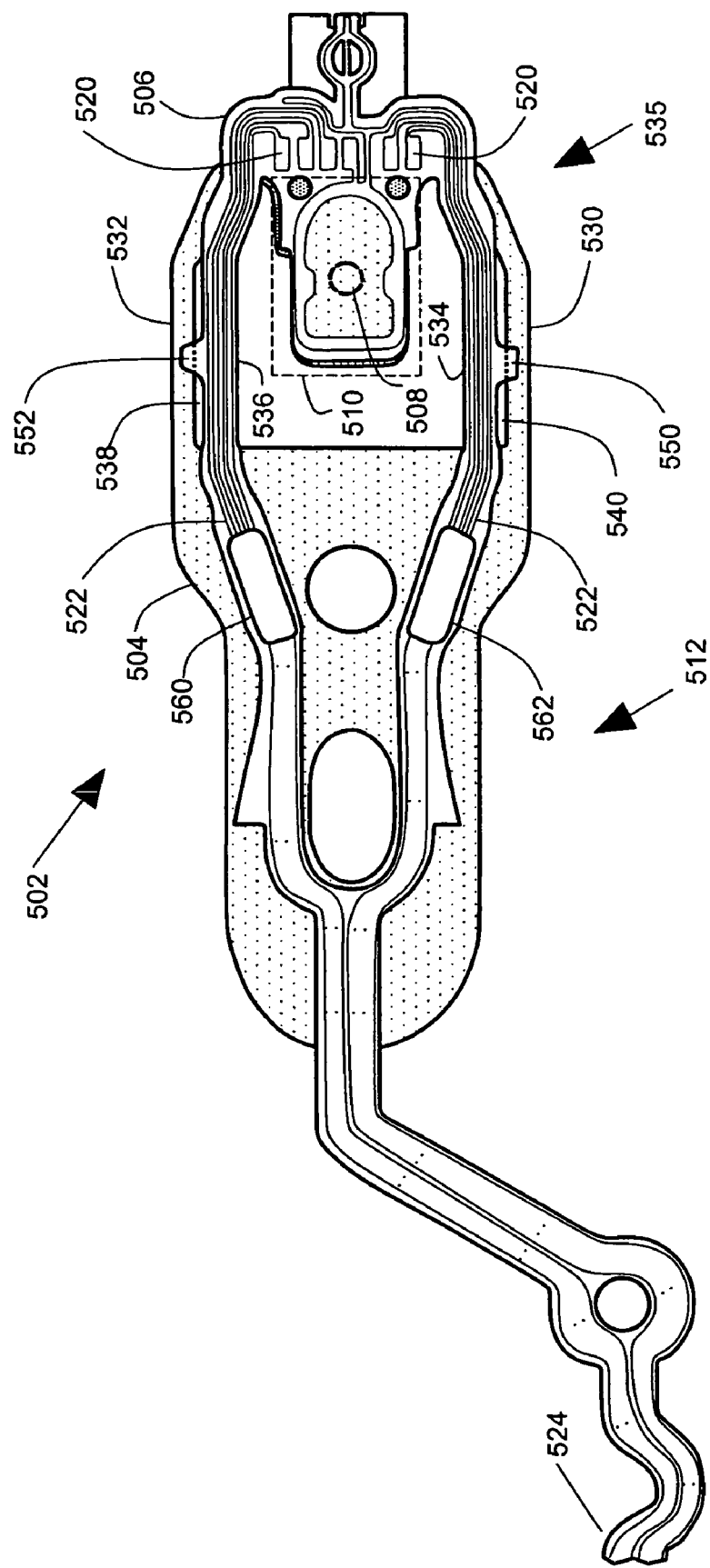
FIG. 5 illustrates a bottom view of an embodiment of a laminate.

FIG. 5 illustrates a bottom view of an embodiment of a laminate 502. The laminate 502 can be formed as described above in connection with FIG. 2. The bottom view shown in FIG. 5 faces a magnetic media disc. A gimbal point (such as gimbal point 408 discussed above) applies a preload force on a top side (hidden from view in FIG. 5) of the laminate 502 at a location indicated by a dashed circle 508.

A slider 510 (such as slider 410 discussed above) is attached to the laminate at a location indicated by dashed rectangle. The laminate is formed of a spring layer 504 and a flex circuit layer 506. The spring layer 504 is indicated by a stippled surface in FIG. 5. A mounting end 512 of the spring layer 504 attaches to a positioning arm (such as positioning arm 402 discussed above). The flex circuit layer 506 has multiple generally rectangular metal contact pads 520 that are positioned for connection to correspondingly positioned slider contacts on the slider 510. Contact between the metal contact pads 520 and the slider contacts is made by ball bonding, stud bumping, thermosonic bonding, soldering or other known interconnection methods. Metal circuit traces 522 extend from the metal contact pads 520 along the length of the flex circuit layer 506 and connect to an electronic circuit at end 524.

The spring layer 504 includes elongate gimbal spring arms 530, 532 that extend from a gimbal end toward the mounting end 512. The flex circuit layer 506 includes elongate flex circuit arms 534, 536 separated from the elongate gimbal spring arms 530, 532 by gaps 538, 540. The flex circuit layer 506 include flex resin circuit tabs 550, 552 that extend across the gap 538, 540 to attachment points on the elongate gimbal spring arms 530, 532. The process of preparing the laminate 502, as described above in connection with FIG. 2, leaves the flex circuit tabs 550, 552 bonded to the elongated gimbal spring arms 530, 532. No production step is needed to attach the resin flex circuit tabs 550, 552 to the elongated spring arms 530, 532. Conformal coating regions 560, 562 cover selected portions of the circuit traces 522.

Figure 6:
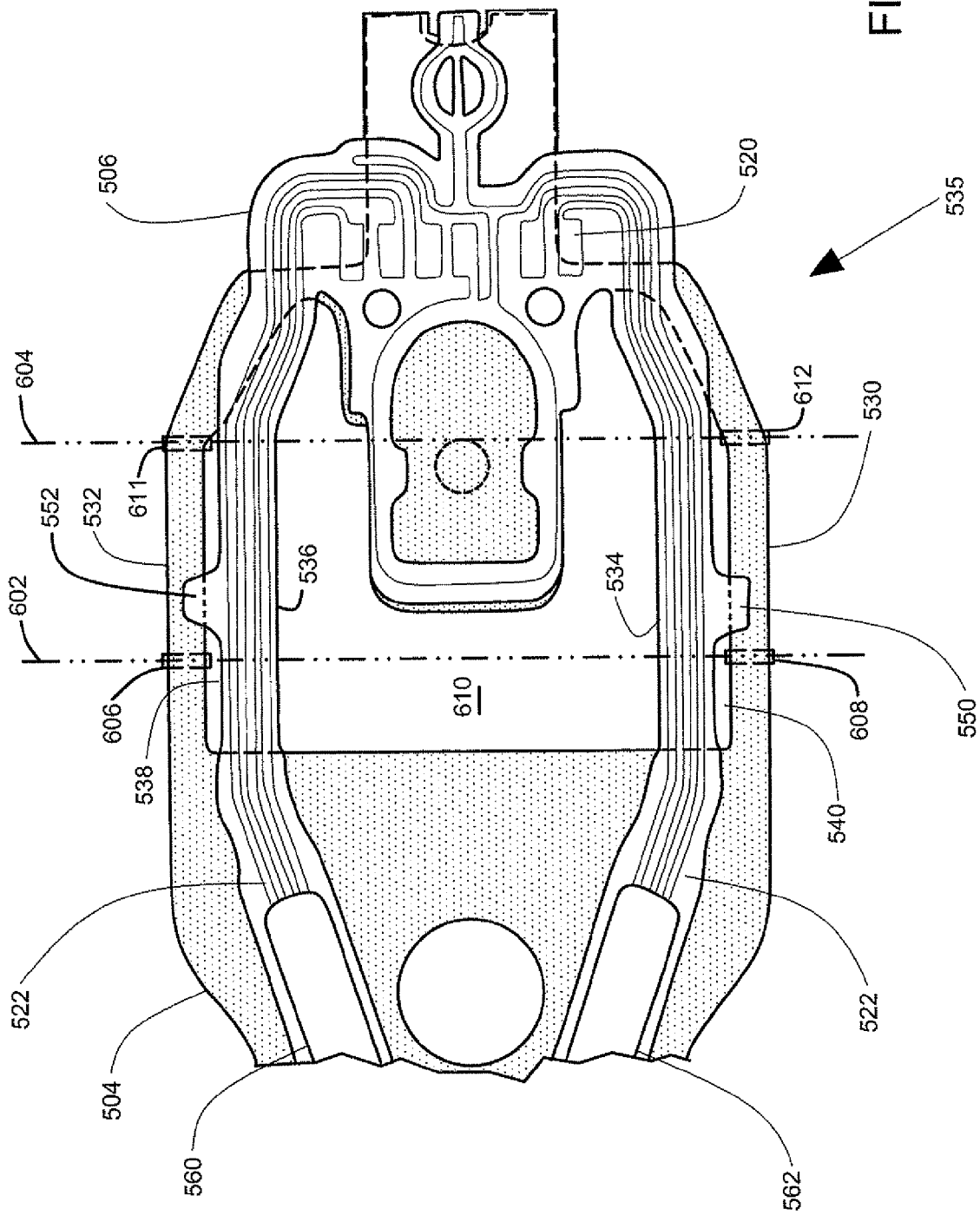
FIG. 6 illustrates an enlarged view of a gimbal end of the laminate shown in FIG. 5.

FIG. 6 illustrates an enlarged view of the gimbal end 535 shown in FIG. 5. Reference numbers used in FIG. 6 that are the same as reference numbers used in FIG. 5 identify the same features.

As illustrated in FIG. 6, the elongate flex circuit arm 536 extends across aperture 610 and is not directly supported by any underlying spring layer 504 in the aperture 610. The elongate flex circuit arm 534 extends across aperture 610 and is not directly supported by any underlying spring layer 504 in the aperture 610. The metal in flex circuit arms 534, 536 are subject to relaxation of residual mechanic stress. The flex circuit arms 534, 536 are kept separated from the gimbal spring arms 530, 532 by the gaps 538, 540 so that relaxation of the mechanical stress does not affect bending of the spring arms 530, 532. The forming of the spring arms during the adjust process does not yield the flex circuit arm and induce stress in the copper.

The elongate flex circuit arms 534, 536 are flexible and are subject to being oscillated (vibrated) due to windage from adjacent spinning magnetic media. The oscillations of the elongate flex circuit arms 534, 536 couple to the slider and cause undesired vibration of the slider and deteriorate accuracy of reading and writing data on the magnetic media, particularly with higher areal density magnetic media. The resin tabs 550, 552, however, provide resilient restraints of the elongate flex circuit arms 534, 536. The tabs 550, 552 damp the motion of the elongate flex circuit arms 534, 536 and reduce the oscillations due to windage. The use of a resin layer for tabs 550, 552 provide mechanical damping and reduces coupling of oscillation through the tabs 550, 552. Polyimide material, which is more flexible than steel, has especially good mechanical damping characteristics when used in tabs 550, 552. The use of metal or other more rigid material in tabs 550, 552 is avoided. If the tabs 550, 552 are instead formed of metal in the spring layer 504, the advantages of the mechanical damping and decoupling of oscillations are lost.

The gimbal end 535 of the laminate 502 includes a first bending axis 602 and a second bending axis 604. The elongate gimbal spring arms 530, 532 are adjusted by bending in bend adjustment regions 606, 608, 611, 612 that are aligned with a bending axis. Initial (coarse) bend adjustments are made by bending the bend adjustment regions 606, 608 about the first bending axis 602. Second (fine) bend adjustments are made, after assembly with a positioning arm (such as positioning arm 404 in FIG. 4) and a slider (such as slider 410 in FIG. 4), by bending the bend adjustment regions 611, 612 about the second bending axis 604. The bending adjustments adjust the pitch static attitude (PSA) and the roll static attitude (RSA) of the slider. The flex circuit tabs 550, 552 have deflections responsive to the bending adjustments. The deflections of the flex circuit tabs 550, 552 prevents flex circuit yielding and relieves residual stress build up in the flex circuit layer (resin layer and circuit trace layer). The flex circuit tabs 550, 552 are free of circuit traces and are deflectable to relieve residual stress in the elongate flex circuit arms 534, 536 after bending adjustments. The flex circuit tabs 550, 552 function as solid state axles, permitting the rotation of the elongate flex circuit arm away from the gimbal spring arms 530, 532.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the suspension system while maintaining substantially the same functionality without departing from the scope and spirit of the present invention. In addition, although the preferred embodiment described herein is directed to a disc drive system for data storage, it will be appreciated by those skilled in the art that the teachings of the present invention can be applied to other suspension systems for transducers, without departing from the scope and spirit of the present invention.

What is claimed is:

1. A slider suspension assembly, comprising:
    a positioning arm, having a mounting end and a gimbal end;
    a laminate mounted to the positioning arm and including a spring layer and a flex circuit layer, the spring layer including an elongate gimbal spring arm, and the flex circuit layer including an elongate flex circuit arm separated from the elongate gimbal spring arm by a gap, the flex circuit layer including a flex circuit tab that extends across the gap to an attachment point on the elongate gimbal spring arm, the flex circuit layer including electrical contact pads; and
    first and second bend adjustment regions spaced apart along a length of the elongate gimbal spring arm, the first and second bend adjustment regions being located between the electrical contact pads and the positioning arm mounting end, and the attachment point is positioned between the first and the second bend adjustment regions, wherein the flex circuit layer includes a circuit trace layer and a resin layer, and the flex circuit tab is formed in the resin layer, is free of circuit traces and is deflectable to relieve residual stress in the elongate flex circuit arm.

2. The slider suspension assembly of claim 1, wherein at least one of the first and second bend adjustment regions is provided with a bend adjustment, and the flex circuit tab has a deflection responsive to the bend adjustment, and the deflection response prevents flex circuit yielding, relieving residual stress build up in the flex circuit layer.

3. The slider suspension assembly of claim 1, wherein the flex circuit tab damps windage vibration of the elongate flex circuit arm.

4. The slider suspension assembly of claim 1 and further comprising a first bend adjustment for adjusting static attitude.

5. The slider suspension assembly of claim 1, wherein the flex circuit layer includes a cover layer that covers selected portions of the circuit trace layer.

6. The slider suspension assembly of claim 1, wherein the resin layer comprises polyimide.

7. The slider suspension assembly of claim 1, wherein the flex circuit tab functions as a solid state axle permitting the rotation of the elongate flex circuit arm.

8. The slider suspension assembly of claim 1, where the spring layer and flex circuit layer have shapes that are defined by selective etching in a photolithographic process.

9. A gimbal assembly, comprising:
    a spring layer including an elongate gimbal spring arm and a gimbal point region; and
    a flex circuit layer including an elongate flex circuit arm separated from the elongate gimbal spring arm by a gap, the flex circuit layer including a flex circuit tab that extends across the gap to an attachment point on the elongate gimbal spring arm, the flex circuit layer including electrical contact pads, and an electronic circuit connection portion;
    first and second bend adjustment regions spaced apart along a length of the elongate gimbal spring arm, the first bend adjustment region being located between the gimbal point region and the electrical contact pads, the second bend adjustment region being located between the gimbal point region and the electronic circuit connection portion, and the attachment point is positioned between the first and the second bend adjustment regions;
    a gimbal point that applies a preload force at the gimbal point region; and wherein the flex circuit layer includes a circuit trace layer and a resin layer, and the flex circuit tab is formed in the resin layer, is free of circuit traces and is deflectable to relieve residual stress in the elongate flex circuit arm.

10. The gimbal assembly of claim 9 wherein the flex circuit tab damps windage vibration of the elongate flex circuit arm.

11. The gimbal assembly of claim 9 wherein the resin layer comprises polyimide.

12. The gimbal assembly of claim 9, wherein at least one of the first and second bend adjustment regions is provided with a bend adjustment.

13. The gimbal assembly of claim 12, and further comprising a first bend adjustment for adjusting static attitude.

14. The gimbal assembly of claim 13, and further comprising a second bend adjustment that adjusts static attitude.

15. A slider suspension assembly, comprising:
    a positioning arm; and
    a laminate mounted to the positioning arm and including a spring layer, a resin layer and a circuit trace layer, the spring layer including an elongate gimbal spring arm, and the resin and circuit trace layers including an elongate flex circuit arm separated from the elongate gimbal spring arm by a gap, the resin layer including a protruding flexible resin tab that extends across the gap to an attachment point on the elongate gimbal spring arm, the circuit trace layer including contact pads at one end and an electronic circuit connection point at another end, and the protruding flexible resin tab is free of circuit traces and is deflectable to relieve residual stress in the elongate flex circuit arm; and
    first and second bend adjustment regions spaced apart along a length of the elongate gimbal spring arm, the first and the second bend adjustment regions being located between the contact pads and the electrical circuit connection point, and the attachment point is positioned between the first and the second bend adjustment regions.

16. The slider suspension assembly of claim 15 wherein the flex resin tab damps windage vibration of the elongate flex circuit arm.

17. The slider suspension assembly of claim 15, wherein the resin tab damps vibration of the elongate flex circuit arm.

18. The slider suspension assembly of claim 15, wherein the resin tab functions as a solid state axle, permitting rotation of the spring arm relative to the flex circuit arm to decouple residual stress build up.

19. The slider suspension assembly of claim 15, wherein the protruding flexible resin tab comprises polyimide resin.

20. The slider suspension assembly of claim 15, wherein the positioning arm includes a gimbal point that provides a preload force to a portion of the laminate that overlies a slider.

* * * * *